(12) United States Patent
Garcia et al.

(10) Patent No.: US 9,118,332 B2
(45) Date of Patent: Aug. 25, 2015

(54) DIGITAL COUNTER AND METHOD FOR MEASURING A PERIOD OF TIME

(75) Inventors: Lucien Garcia, Tournefeuille (FR); Jérôme Hou, Saint-Alban (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 255 days.

(21) Appl. No.: 13/818,381

(22) PCT Filed: Aug. 3, 2011

(86) PCT No.: PCT/EP2011/003881
§ 371 (c)(1),
(2), (4) Date: May 9, 2013

(87) PCT Pub. No.: WO2012/025191
PCT Pub. Date: Mar. 1, 2012

(65) Prior Publication Data
US 2013/0223583 A1    Aug. 29, 2013

(30) Foreign Application Priority Data

Aug. 24, 2010  (FR) ..................... 10 03427

(51) Int. Cl.
*G04F 10/04* (2006.01)
*H03K 23/00* (2006.01)
*H03K 21/40* (2006.01)
*H03K 21/02* (2006.01)

(52) U.S. Cl.
CPC ............... *H03K 23/00* (2013.01); *G04F 10/04* (2013.01); *H03K 21/023* (2013.01); *H03K 21/40* (2013.01)

(58) Field of Classification Search
CPC ... H03K 21/023; H03K 21/40; H03K 21/406; G04F 10/04
See application file for complete search history.

(56) References Cited

U.S. PATENT DOCUMENTS

| 4,086,470 A | 4/1978 | Ashbee |
| 6,882,697 B1 | 4/2005 | Galuschka |
| 2005/0089132 A1 | 4/2005 | Galuschka |

FOREIGN PATENT DOCUMENTS

| CN | 1731299 A | 2/2006 |
| JP | 57 141135 | 9/1982 |

OTHER PUBLICATIONS

International Search Report dated Sep. 16, 2011, corresponding to PCT/EP2011/003881.

*Primary Examiner* — Patrick O'Neill
(74) *Attorney, Agent, or Firm* — Young & Thompson

(57) ABSTRACT

A method for measuring a period of time between a first event and a second event via a hardware counter 2 and of a software counter 3. A digital counter 1 using such a method is also described.

9 Claims, 4 Drawing Sheets

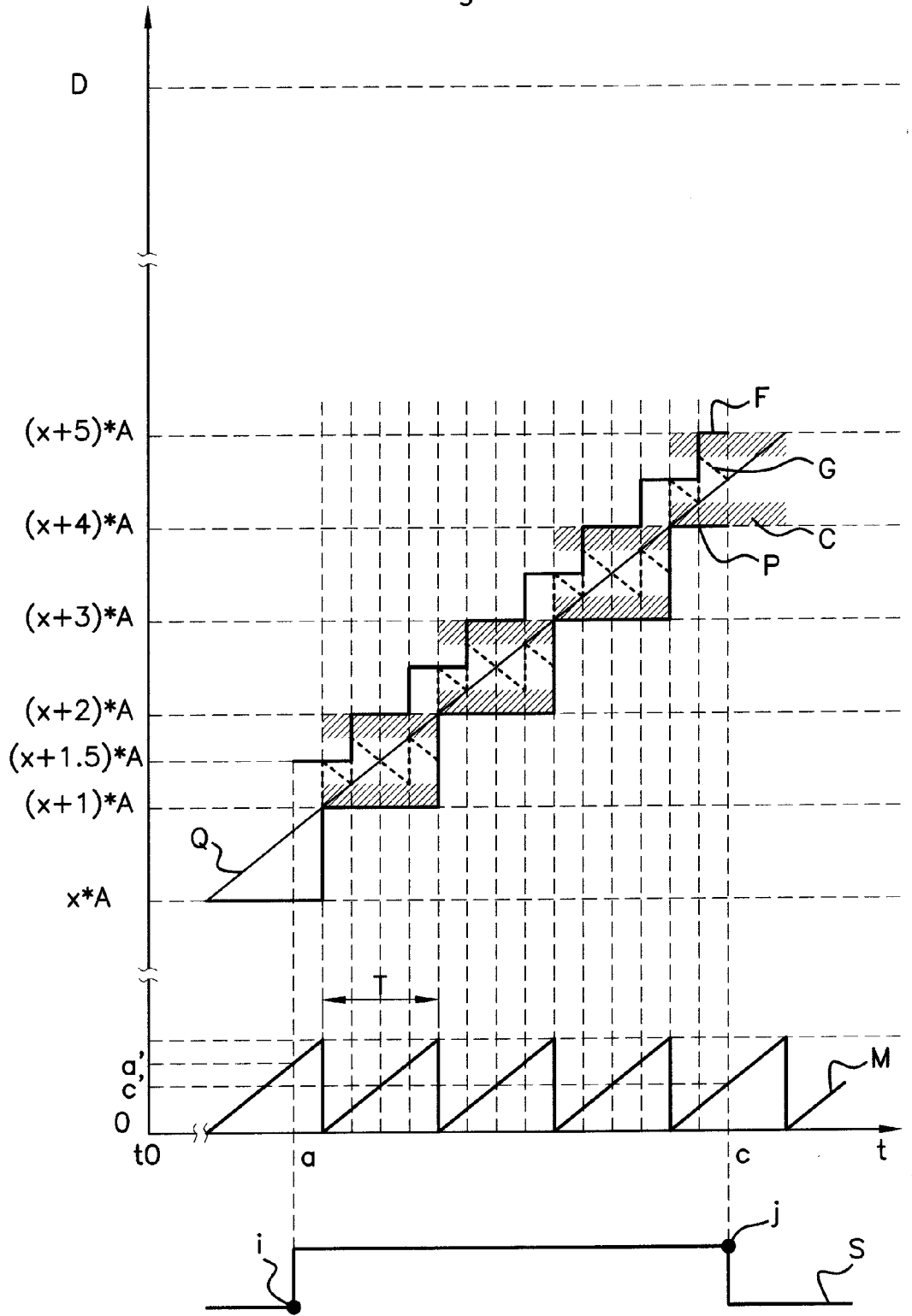

DIGITAL COUNTER AND METHOD FOR MEASURING A PERIOD OF TIME

The invention relates to a digital counter such as used for example in information technology microprocessors and a method for measuring a period of time between two events.

A digital counter according to the prior art comprises a hardware counter whose value is coded on n bits. The value of the hardware counter is incremented by a clock. Thus, this value increases from an initial value, typically 0, up to a maximum value A. When the hardware counter reaches its maximum value A, the hardware counter is said to overflow. After an overflow, the hardware counter is reset. The periodic behavior of the value of the hardware counter is shown in FIG. 1 by the curve M.

Figure 1:
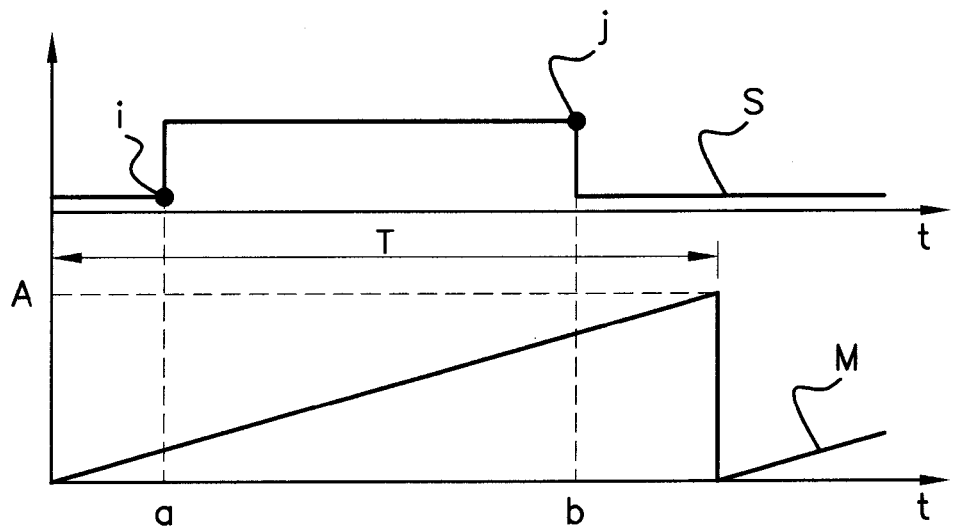

Thus, when the hardware counter is used to quantify a time period shorter than the period T of the hardware counter, for example the period of time (b-a) shown in FIG. 1, the hardware counter in and of itself suffices.

Figure 2:
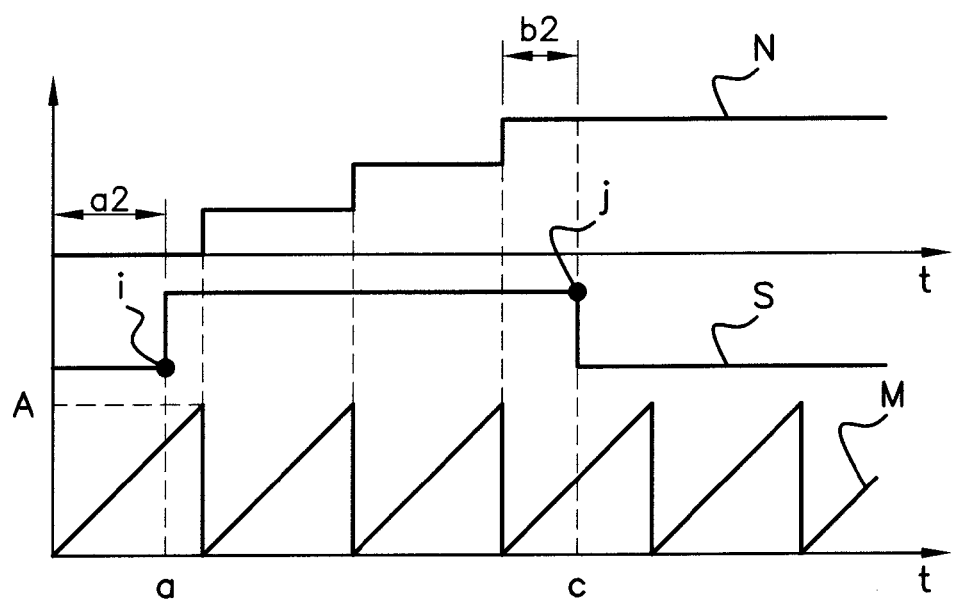

On the other hand, when the hardware counter is used for quantifying a period of time longer than the period T of the hardware counter, for example the period of time (c-a) shown in FIG. 2, the hardware counter is not sufficient.

In order to measure periods of time longer than the period T of the hardware counter, digital counters known from the prior art comprise at least one hardware counter, one processor and one overflow counter. The overflow counter is used to quantify the number of overflows of the hardware counter. More particularly, the processor increments the overflow counter by one unit each time that the hardware counter overflows. The ideal behavior of the overflow counter is shown in FIG. 2 by the curve N. Ideally, it is observed here that the incrementation of the overflow counter occurs exactly at the moment of the overflow of the hardware counter. In the example shown in FIG. 2, the period of time (c-a) between a first event (i) and a second event (j) is thus equal to the period of time b2 added to the time corresponding to three overflows, from which the value of the period a2 is subtracted.

The real behavior of this type of digital counter is such that the incrementation of the software counter cannot be strictly simultaneous with the overflow of the hardware counter for the reasons presented hereinabove.

First of all, when the hardware counter reaches its maximum value A, an interrupt of the processing operations in progress is generated in order to allow the processor to increment the overflow counter. However, this interrupt is already delayed with respect to the overflow of the hardware counter, at least owing to the fact that the processor has to save the processing operations in progress. This delay can only be minimized, but not completely eliminated, if the priority level of the interrupt is very high with respect to the priority level of the processing operations in progress. However, here again, this delay is due to the time taken for performing, separately and successively, the following unavoidable steps:
  a step for reading the instantaneous value of the hardware counter and for comparison with the maximum value A of the hardware counter before the step for generation of the interrupt,
  then, a step for incrementing the overflow counter.

Figure 3:
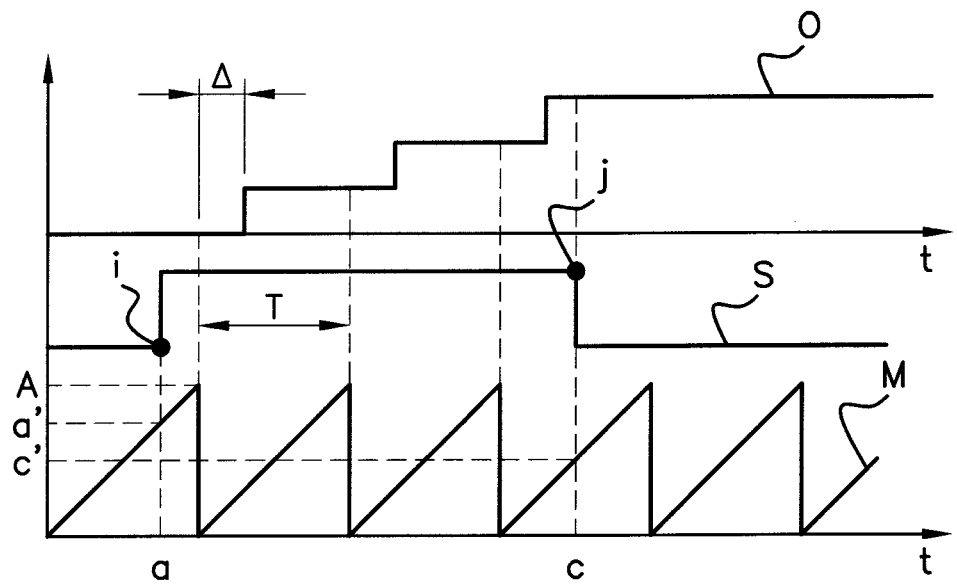

Thus, the incrementations of the overflow counter are not, in practice, simultaneous with the overflows of the hardware counter. The real behavior of the overflow counter is shown in FIG. 3 by the curve O and the delay in the interrupt with respect to the overflow of the hardware counter is shown in the same figure by the symbol $\Delta$ (with $\Delta \ll T$).

This problem is known from the prior art and software solutions exist for correcting the delay in the incrementation of the overflow counter with respect to the overflow of the hardware counter. One of these software solutions consists in determining whether or not an interrupt is pending and in adjusting the count of the overflow counter accordingly. Another software solution, non-exclusive of the first, consists in requesting the interrupt for a given threshold value of the hardware counter lower than its maximum value A. This solution requires a step for reading the instantaneous value of the hardware counter and for comparison with said given threshold value and can be optimized as a function of said given threshold value. However, on the one hand, these software solutions are complicated and cumbersome to implement (to the extent that, since they demand a high priority level, they considerably delay the processing operations in progress) and, on the other hand, they only allow the error committed to be corrected without it being eliminated.

In order to eliminate said error committed, the need for coincidence between each overflow of the hardware counter and a processor interrupt for incrementing the overflow counter must be circumvented. For this purpose, the patent referenced U.S. Pat. No. 6,882,697 B1 teaches of a software solution which consists in reading the value of the hardware counter at least twice, during the same time period T, while choosing the read times in such a manner that none of them coincide with the overflow of the hardware counter. More particularly, the solution provided consists in combining the hardware counter with a first software counter on a first half-period of the hardware counter and in combining the hardware counter with a second software counter on a second half-period of the hardware counter, such that the half-period during which one of the two software counters is combined with the hardware counter does not coincide with the moment at which the other software counter is incremented. Thus, each combination gives the relevant duration on its half-period of definition. This solution first of all has the drawback of requiring two software parts which makes its implementation complex and cumbersome. It also has the drawback of requiring it to be determined on which half-period of the hardware counter the second event marking the end of the period of time to be measured occurs in order to choose which of the two software counters gives the period of time to be measured in combination with the hardware counter.

The invention aims to overcome one or more of the drawbacks of the prior art by providing a digital counter and a method for measuring a period of time between two events that are simpler, faster and/or more stable, which allow the problem associated with the delay of the interrupt with respect to the overflow of the hardware counter to be avoided, and which are not solely adapted to a single processor system, but also to a multiprocessor system, and/or whose impact on the processing operations in progress is very limited.

For this purpose a method is provided for measuring a period of time between two events, the method implementing a digital counter comprising:
  a hardware counter whose value is coded on n bits, and
  a software counter whose value is coded on m bits,
the method comprising a step for incrementing the software counter at at least two predetermined values of the hardware counter, none of these two values coinciding with an overflow of the hardware counter, such that, the value of the digital counter being coded on m+n−1 consecutive bits of which:
  n least significant bits correspond to the value of the hardware counter, and
  m−1 most significant bits are defined as a function of the value of the software and hardware counters,
the method furthermore comprises:

a step for resetting the software counter according to the value of the hardware counter at the time of the first event, a step for reading and for saving the value of the hardware counter at the time of the first event and the value of the hardware counter at the time of the second event, a step for calculating the number of overflows of the hardware counter between the two events on the basis of the value of the software counter and of the value of the hardware counter at the time of the second event, and a step for calculating the period of time between the two events on the basis of the value of the hardware counter at the time of the first event, the value of the hardware counter at the time of the second event and the number of overflows previously calculated.

The method thus allows the real-time constraints to be avoided and is simpler, at least in that it only requires a single software counter valid on the whole range of values of the hardware counter and in that it does not require any particular software test at the time of the second event, simply reading the hardware and software counters at the time of this second event allowing the calculation of the period of time to be measured.

According to one feature, the step for calculating the number of overflows of the hardware counter between the two events consists of:

a step for calculating the difference between the value of the software counter at the time of the second event and the value of the hardware counter at the time of the first event, and a step for calculating the value corresponding to the integer part of the difference previously calculated.

The method thus makes judicious use of the calculation of an integer value in order to achieve an enhanced numerical stability.

According to another feature, the step for incrementing the software counter is carried out when the value of the hardware counter corresponds to one quarter and to three quarters of its maximum value.

According to another feature, the step for resetting the software counter consists in assigning to the software counter:

an initial value equal to half of the value of the hardware counter when the value of the hardware counter at the time of the first event (i) is greater than or equal to zero and strictly less than one quarter of its maximum value, an initial value equal to the maximum value of the hardware counter when the value of the hardware counter at the time of the first event (i) is greater than or equal to one quarter of its maximum value and strictly less than three quarters of its maximum value and, an initial value equal to three halves of the maximum value of the hardware counter when the value of the hardware counter at the time of the first event (i) is greater than or equal to three quarters of its maximum value and strictly less than its maximum value.

According to another feature, the step for calculating the period of time between the two events consists in adding, to the number of overflows of the hardware counter between the two events, the value corresponding to the difference between the value of the hardware counter at the time of the second event and the value of the hardware counter at the time of the first event.

According to another feature, the priority level of the step for resetting and of the step for incrementing the software counter is determined so as to allow the implementation of the incrementation prior to the expiration of a time corresponding to a quarter of the maximum value of the hardware counter.

The method thus allows a low priority level to be assigned to the tasks consisting in resetting and incrementing the software counter, with respect to the priority level of the processing operations in progress, the delay in the latter then being minimized.

The invention also provides a digital counter designed to measure a period of time between two events, comprising:

a hardware counter whose value is coded on n bits, and a software counter whose value is coded on m bits, the software counter being incremented at at least two predetermined values of the hardware counter, none of these two values coinciding with an overflow of the hardware counter, such that the value of the digital counter is coded on m+n−1 consecutive bits of which:

n least significant bits correspond to the value of the hardware counter, and m−1 most significant bits are defined as a function of the value of the software and hardware counters, the digital counter being such that:

the software counter is reset according to the value of the hardware counter at the time of the first event, the value of the hardware counter during the first and second events is read and saved, the number of overflows of the hardware counter between the two events is calculated on the basis of the value of the software counter and of the value of the hardware counter at the time of the second event, and the period of time between the two events is calculated on the basis of the number of overflows, the value of the hardware counter at the time of the second event and the value of the hardware counter at the time of the first event.

According to one feature, the digital counter is connected to a processor capable of reading the value of the hardware counter, resetting the software counter and performing the calculations, the processor being connected to at least one storage medium on which it stores data.

According to another feature, the period of the hardware counter is determined by the number of bits on which the value of the hardware counter is coded and by the frequency at which the hardware counter is incremented, this frequency being an integer fraction of the clock frequency of the processor.

According to one feature, the number n of bits is equal to 24 and the number m of bits is equal to 9 such that the value of the digital counter is coded on 32 consecutive bits.

Figure 4:
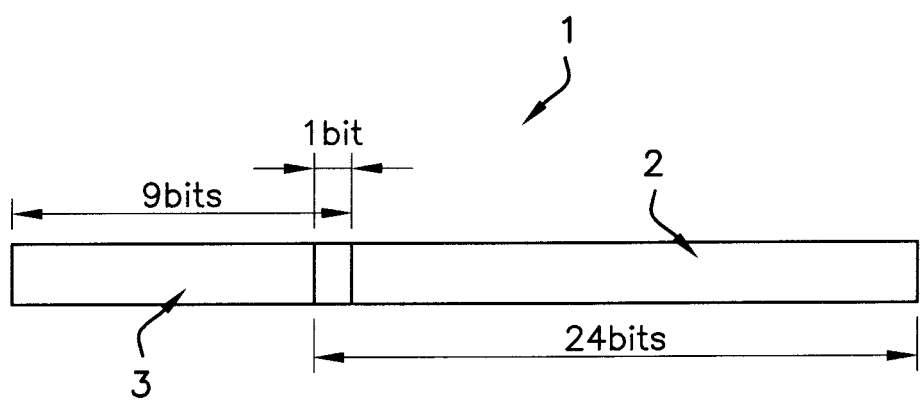
Figure 5:
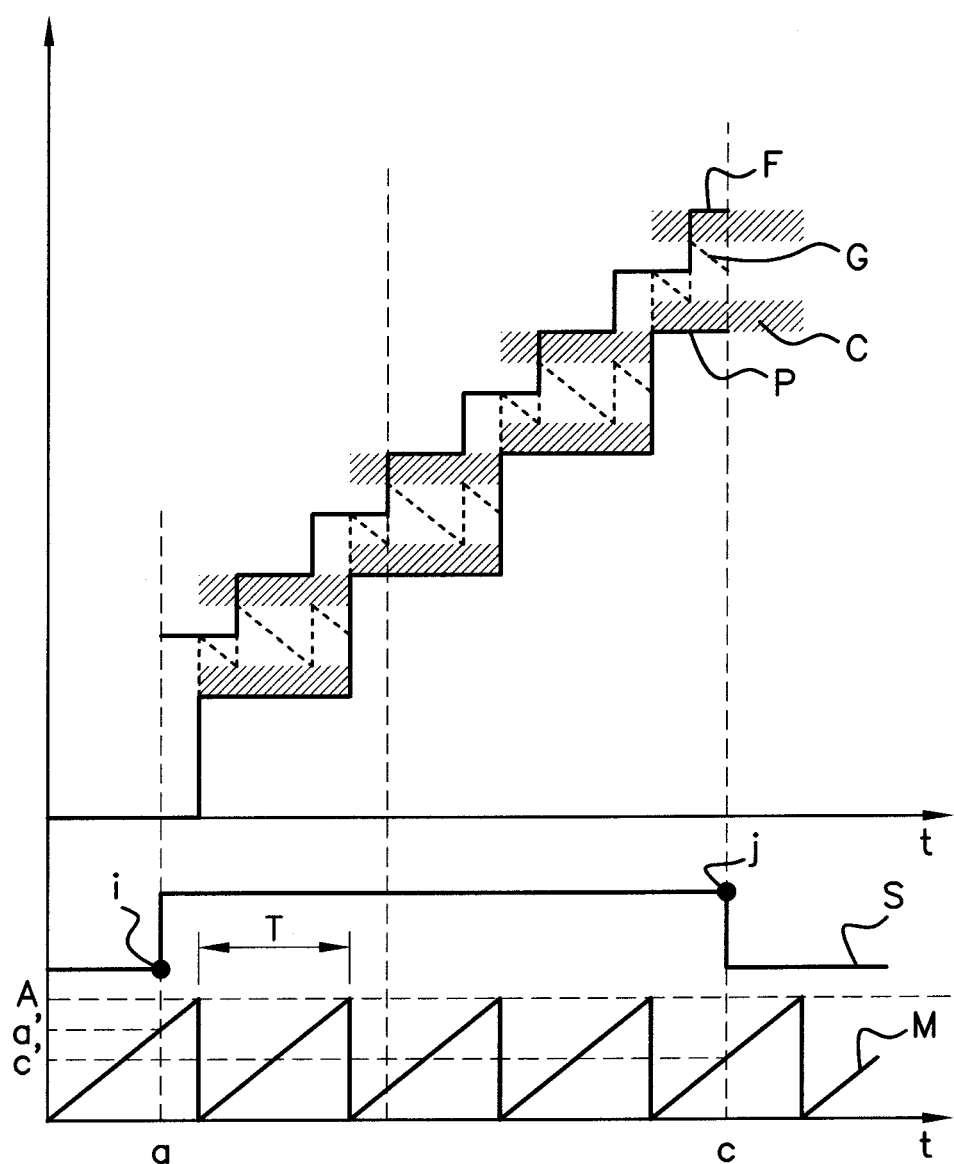

Other features and advantages of the invention will become apparent upon reading the description that follows, with reference to the appended figures, amongst which:

FIG. 1 shows a graph on which two curves appear: one curve M showing the periodic behavior of a hardware counter and a curve S showing a signal whose duration to be measured is less than the period T of the hardware counter, FIG. 2 shows a graph on which three curves appear: the curve M such as in FIG. 1, a curve S showing a signal whose duration to be measured is longer than the period T of the hardware counter and the curve N showing the behavior as a function of time of an ideal overflow counter, FIG. 3 shows a graph on which three curves appear: the curve M and the curve S such as in FIG. 2 and the curve O showing the behavior as a function of time of a real overflow counter, FIG. 4 shows schematically the digital counter according to the invention comprising a hardware counter juxtaposed with a software counter, FIG. 5 shows a graph on which five curves appear: the curve M and the curve S such as in FIG. 2, the curve F showing the behavior of the value of the software counter according to the invention, the curve G showing the behavior of the difference between the value of the curve F and the corresponding value of the curve M, and the curve P showing the behavior of the integer value of the curve G, the latter being rigorously identical to the curve N in FIG. 2 which shows the behavior as a function of time of an ideal overflow counter, and FIG. 6 shows a graph on which appear, on the one hand, the same five curves as in FIG. 5 and, on the other hand, the curve O showing the behavior of the instantaneous value of the overflow counter P to which the corresponding value of the hardware counter is added, the units on the ordinate being expressed in terms of the time measurement units of the hardware counter.

The digital counter is designed to enable the measurement of a period of time between two events: a first event i and a second event j. Said period of time can be the duration of reception of an input signal, the duration of emission of an output signal, or alternatively the duration of processing of a task. In FIG. 5, the curve S illustrates the time-varying nature of such a signal, the period of time to be measured being equal to (c−a).

The digital counter 1 firstly comprises a hardware counter 2, whose periodic behavior is represented by the curve M in FIG. 5. The value of the hardware counter is furthermore coded on n bits. Thus, the maximum value of the hardware counter, denoted 'A' in FIGS. 1, 2, 3, 5 and 6, is equal to $2^n-1$. The number 'n' of bits is preferably equal to 24. The value of the hardware counter coded on n bits is a number which expresses the time measured by the hardware counter in a time measurement unit of the hardware counter. The time measurement unit of the hardware counter correspond to the time in seconds between two incrementations of the hardware counter. For example, said value of the hardware counter coded on n bits is thus that appearing as ordinate in FIG. 6. The time in time measurement unit of the hardware counter corresponding to the difference (c−a) corresponds to the difference (c'−a') to which is added the product of the maximum value of the hardware counter and the number of overflows (x) of the hardware counter between the two events. The time in seconds corresponding to the difference (c−a) corresponds to the time in time measurement unit of the hardware counter corresponding to the difference (c−a) multiplied by time measurement unit of the hardware counter.

The digital counter 1 secondly comprises a software counter 3. The value of the software counter is coded on m bits. This number of bits m is preferably equal to 9. However, since the basic unit of processor registers is often the byte, these 9 bits will need to be handled in a variable of the 16-bit type, also known as a doublet. The value of the software counter coded on m bits is a number corresponding to the number of incrementations of the software counter in the time measurement unit of one incrementation of the software counter. The time measurement unit for one incrementation of the software counter corresponds to the time between two incrementations of the software counter; this time depends on the difference between the value of the hardware counter when the software counter is incremented and the value of the hardware counter at the time of the next incrementation, this difference expressing a time in time measurement units of the hardware counter. For example, said value of the hardware counter coded on n bits is thus that appearing as ordinate in FIG. 6.

In a second example, a change of time scale can be applied which consists in multiplying the ordinate in FIG. 6 by the time measurement unit of the hardware counter so that the latter is no longer expressed in time measurement unit of the hardware counter but directly in seconds.

As shown in FIG. 4, the value of the digital counter 1 is, for its part, coded on m+n−1 consecutive bits, or preferably 32 consecutive bits, of which n least significant bits correspond to the value of the hardware counter 2 and m−1 most significant bits are defined according to the value of the software and hardware counters. More particularly, the value of the least significant bit of the software counter depends at least on the value of the most significant bit of the hardware counter. This concatenation of the hardware and software counters advantageously allows the value of the digital counter to be expressed on 32 consecutive bits by the manipulation of the bits coding the value of the hardware counter and the value of the software counter, this manipulation being carried out in a simple and perfectly controlled manner using bit-manipulation operators. This point will be considered further hereinbelow.

The digital counter also comprises a processor and a storage medium connected to said processor. The processor comprises a clock. The tasks performed by the processor are thus synchronized by a clock signal with a given frequency. The clock preferably runs at a frequency of 5 MHz. The period T of the hardware counter is fixed in seconds by the number of bits on which its value is coded and by the frequency at which it is incremented. The latter can be the clock frequency or, more generally, an integer fraction of the clock frequency. The inverse of the frequency of incrementation of the hardware counter is in fact the time measurement unit of the hardware counter.

The processor is designed to perform a plurality of tasks, each task having a given priority level. In a non-exhaustive manner, the processor is thus designed to read and write data on the storage medium and to perform calculations, or, more particularly, to manipulate bits such as for example the bits coding the value of the hardware, software and digital counters.

In its wider sense, the software counter is incremented each time the hardware counter passes through at least two of its values. These two values are predetermined and notably different from the zero and maximum values of the hardware counter. It is precisely because the software counter is incremented at least twice per period of the hardware counter that the most significant bit of the hardware counter is not representative of an overflow of the hardware counter and that the teaching here is to concatenate the software and hardware counters in order to reconstruct an overflow counter, then the digital counter.

In the first embodiment of the digital counter and in order to limit the impact of the management of the digital counter on the processing operations in progress, it has been decided to limit the choice to two predetermined values through which the hardware counter passes to justify the incrementation of the software counter. Indeed, the larger the number of these predetermined values, the larger the number and hence the higher the cost in time will be the tasks of the processor associated with the operation of the digital counter. However, it should be noted that the invention such as claimed does not have to be limited to this single choice. It may just as easily be envisioned to predetermine any given integer number of values through which the hardware counter passes to justify the incrementation of the software counter.

In the first embodiment of the digital counter, it has been chosen for the first and the second predetermined values through which the hardware counter passes to justify the incrementation of the software counter to be fixed at one quarter and at three quarters of the maximum value of the hardware counter, respectively. This particular choice allows the management of the incrementation of the software counter to be undertaken far away (in time) from an overflow of the hardware counter and thus to circumvent the real-time constraints. In a correlated manner, this choice also has the advantage of greatly simplifying the implementation of the digital counter, because it allows the periodicity of the hardware counter to be fully exploited. On the one hand, the time between a first overflow of the hardware counter and its passage through the first predetermined value is equal to the time between the passage of the hardware counter through the second predetermined value and a second overflow, this period of time being equal to a quarter of the period of the hardware counter. On the other hand, the time corresponding to the passage of the hardware counter from the first predetermined value to the second predetermined value is equal to a half-period of the hardware counter. The exploitation of these symmetries allows the implementation of the method implementing the digital counter to be rendered simpler and more stable. However, it should be noted that the invention such as claimed does not need to be limited to this single choice. Indeed, it may just as easily be envisioned for the first predetermined value to be included within a first interval going for example from 10% to 40% of the maximum value of the hardware counter and for the second predetermined value to be included within a second interval going for example from 60% to 90% of the maximum value of the hardware counter.

It should furthermore be noted that the chosen integer number of values through which the hardware counter passes to justify of the incrementation of the software counter just needs to be an even number in order to be able to fully exploit the periodicity of the hardware counter according to the features presented hereinabove. In any event, it is preferable to limit the choice to two predetermined values, with the sole purpose of limiting the impact of the digital counter on the processing operations in progress.

In the first embodiment of the digital counter, it is therefore justified for the software counter to be incremented, by one time measurement unit of the software counter, each time that the hardware counter goes through a value equal to one quarter of its maximum value or to three quarters of its maximum value. The time variation of the software counter thus obtained is represented by the curve F in FIG. 5. More rigorously, this curve F represents the ideal behavior of the software counter described hereinabove. Indeed, each incrementation of the software counter is shown here as being simultaneous with the passage of the hardware counter through a value equal to one quarter or to three quarters of its maximum value.

The ideal behavior of the overflow counter, such as shown in FIG. 2, has been reproduced in FIGS. 5 and 6 by the curve P. Notably, it can be observed graphically that the two curves F and P show regular staircase time variations that are different from one another in that the curve F is constantly higher than the curve P and in that the steps of the staircase F are half the height and half the length of the steps of the staircase P.

If the curve showing the behavior of the value of the software counter from which has been subtracted the value of the hardware counter is traced, the curve G such as illustrated in FIGS. 5 and 6 is obtained. This curve G is included and oscillates between the upper curve F and the lower curve P. It may be observed that, if at each moment in time the integer value of the curve G is taken, the curve P is obtained. Thus, an ideal overflow counter is obtained or reconstructed based on the value of the hardware counter and on the value of the ideal software counter at each moment in time.

The non-ideal or real behavior of the software counter could be represented by a curve with the same time behavior as the curve F, but where each incrementation would be delayed with respect to the passage of the hardware counter through a value equal to one quarter or to three quarters of its maximum value. Assuming that the delay in the incrementation is constant from one incrementation to another, a curve representing said real behavior of the software counter would be obtained by translating the curve F along the time axis (on the abscissa) by any given value A much less than the period T of the hardware counter. If said given value is in the range between zero included and one quarter excluded of the period of the hardware counter, by taking at each moment in time the integer value of the curve G obtained in combination with this translated curve F, the curve P is obtained. Thus, an ideal overflow counter is obtained based on the value of the hardware counter and on the value of the software counter according to its real behavior at any given time.

In other words, reconstructing the overflow counter on the basis of a non-ideal software counter is strictly equivalent to reconstructing the overflow counter on the basis of an ideal software counter, a delay in the incrementation of the software counter not resulting in any difference, if however this delay does not exceed a quarter of the period of the hardware counter. A margin of error, shown in the FIGS. 5 and 6 by the reference C, is thus permitted without this affecting the duration measurement.

In order to carry out each incrementation of the software counter within a time corresponding to one quarter of the period of the hardware counter, the incrementation does not require a very high priority level, or it can even be carried out as a background task. In addition, if the processor has operations with a higher priority level to be carried out, it can perform them according to their priority without this affecting the precision of the duration measurement. For this reason, the impact of each incrementation of the software counter on the processing operations in progress and also on the duration measurement to be carried out is limited, or even zero.

In addition, reconstructing the overflow counter on m−1 bits as a function of the software counter whose value is coded on m bits and of the hardware counter whose value is coded on n bits, or in an equivalent manner taking the integer part of a difference between two values coded in the form of bits, is a very simple and very stable data processing operation able to be carried out by bit manipulation operators, such as previously discussed. In this case and in the first embodiment of the invention, a first step for the reconstruction of the overflow counter consists in extending the hardware and software counters on 32 bits. A second step consists in using a bit-shift operator in order to shift the 9 bits of the software counter by 23 bits to the left. A second step consists in using a processing operator for subtracting from the 32 bits coding the value of the software counter the 32 bits coding the value of the hardware counter. A third step consists in generating and using a bit masking in order to mask the 24 least significant bits from amongst the 32 bits coding the difference previously calculated. The integer part of the difference between the software counter and the hardware counter is thus obtained, potentially at each moment in time, which corresponds to the value of an ideal overflow counter thus reconstructed.

It should be noted that, since the value of the overflow counter is coded on m−1 bits, the maximum value of the overflow counter is equal to $2^{m-1}-1$.

Thus, instead of having an overflow counter which is incremented only once with a value corresponding to the maximum value of the hardware counter during the overflow of the hardware counter, the digital counter comprises a software counter which is incremented twice with a value corresponding to half the maximum value of the hardware counter, once when the hardware counter has a value substantially equal to a quarter of its maximum value and once when the hardware counter has a value substantially equal to three quarters of its maximum value, this software counter allowing the behavior of an ideal overflow counter to be reconstructed.

The digital counter can furthermore comprise a comparator and interrupt means. The comparator is configured for comparing the instantaneous value of the hardware counter with one of the two predetermined values equal to a quarter of the maximum value of the hardware counter and to three quarters of the maximum value of the hardware counter. In response to a positive comparison of the comparator, the interrupt means request the processor to increment the software counter by a half of the maximum value of the hardware counter. The comparator can perform the above-mentioned comparison at regular intervals of time shorter than a quarter of the period of the hardware counter and chosen so as not to delay the processing operations in progress. For example, when a quarter of the period of the hardware counter is equal to around 800 ms, it is appropriate and sufficient for the comparator be employed every 100 ms.

The hardware counter such as previously described is associated with a method for measuring a period of time between two events i and j implementing it. Said method is more specifically described hereinabove. The various steps of this method are carried out by the processor.

The method comprises at least one step for reading the value of the hardware counter at the time of the first event i.

The method furthermore comprises a step for saving the value of the hardware counter at the time of the first event i on the storage medium.

The method additionally comprises a step for resetting the software counter according to the value of the hardware counter at the time of the first event i. More particularly, this step consists in assigning to the software counter an initial value determined as a function of the interval of values within which is comprised the value of the hardware counter at the time of the first event i. When the value of the hardware counter at the time of the first event i is greater than or equal to zero and strictly less than one quarter of its maximum value, an initial value equal to half of the value of the hardware counter is assigned to the software counter. When the value of the hardware counter at the time of the first event i is greater than or equal to one quarter of its maximum value and strictly less than three quarters of its maximum value, an initial value equal to the maximum value of the hardware counter is assigned to the software counter. When the value of the hardware counter at the time of the first event i is greater than or equal to three quarters of its maximum value and strictly less than its maximum value, an initial value equal to three halves of the maximum value of the hardware counter is assigned to the software counter. It should be noted that, in FIG. 5, the fact that the curve F is constantly higher than the curve P results from this reset step.

The method furthermore comprises a step for incrementing the software counter such as described hereinabove, at least in its wider sense, and in the first embodiment of the digital counter. The incrementation consists in modifying the preceding value of the software counter. Since the latter is coded on m bits, corresponding to the m most significant bits of the digital counter, it suffices for the processor to modify these m bits so that the new coded value is equal to the preceding one added to the value corresponding to half the maximum value of the hardware counter.

The method furthermore comprises a step for saving the value of the hardware counter at the time of the second event j on the storage medium.

The method furthermore comprises a step for calculating the number of overflows of the hardware counter between the two events on the basis of the value of the software counter and the value of the hardware counter at the time of the second event j. This calculation consists in subtracting the value of the hardware counter at the time of the second event from the value of the software counter at the time of the second event and in taking the integer part of this difference. As described hereinabove, this operation allows the number of overflows that would be given by an ideal overflow counter to be obtained at any given moment in time, despite the delay in the incrementation of the software counter, if however this delay does not exceed one quarter of the period of the hardware counter. As described hereinabove, the processor modifies the m most significant bits which hitherto corresponded to the value of the software counter for the new coded value to be equal to the calculated number of overflows. The m most significant bits thus represent a time corresponding to the integer number of periods T of the hardware counter included in the duration to be measured.

The method furthermore comprises a step for calculating the period of time between the two events on the basis of the value of the hardware counter at the time of the first event i, the value of the hardware counter at the time of the second event j and the number of overflows previously calculated. This calculation consists in subtracting the value of the hardware counter at the time of the second event from the value of the hardware counter at the time of the first event and in adding this difference to the number of overflows previously calculated. For this purpose, the processor modifies the n least significant bits which hitherto corresponded to the value of the hardware counter so that the new value coded on these n bits is equal to the difference between the value of the hardware counter at the time of the second event and the value of the hardware counter at the time of the first event. The n least significant bits thus representing a time corresponding to the difference between the duration to be measured and the integer number of periods T of the hardware counter included in the duration to be measured are copied by the processor via an assignment operator onto the n least significant bits previously masked (as described hereinabove).

The digital counter, being expressed by a value coded on a finite number of m+n−1 bits, has a maximum value. More particularly, the maximum value of the digital counter, denoted D in FIG. 6, is equal to $2^{m+n-1}-1$. The digital counter is thus capable of measuring periods of time not exceeding its maximum value multiplied by the time measurement unit of the hardware counter.

It should be noted that it might still be necessary to apply a normalization of at least one of the values coded on n or m bits. The objective is that the period of time to be measured is thus reconstructed on the m+n−1 consecutive bits coding the value of the digital counter, such that it suffices to convert these m+n−1 bits into a corresponding value, for example in base 10, in order to obtain the desired duration measurement achieved in a controlled time unit, still without it being necessary to manipulate or to consider separately said m+n−1 bits. Thus, at the end of the method, the period of time to be measured corresponds to the total formed by the digital counter. The digital counter therefore presents the advantage of enabling the measurement of a period of time to be coded using a hardware counter whose value is coded on n bits within an extended total number of m+n−1 bits.

Preferably, the storage medium on which the processor writes the m+n−1 bits of the digital counter is a non-volatile storage medium, so as to ensure the consistency of the measurement.

The various calculations described hereinabove are, in the present case where the various values mentioned are coded in binary form, performed by bit manipulation operators. Amongst these operators, arithmetic operators (addition, subtraction) may notably be used allowing the value of a variable to be modified mathematically, assignment operators, incrementation operators, comparison operators for example for implementing the reset step, logical operators, bit-to-bit operators for example for generating a bit masking, and/or bit-shift operators. In order to carry out these calculations, the processor makes use of an executable file, for example generated by compilation of a program in C language.

The method for measuring the period of time between two events and the digital counter allow the period of time between two events to be evaluated more precisely and/or in a more stable manner than the methods of the prior art and without requiring more powerful processors or more complex algorithms. Thus, the quantification of this period of time is precise, irrespective of the length of this period of time, and without the interrupts needing a high priority level. Furthermore, this quantification is relatively independent of the speed of the processor. The digital counter also has the advantage of being robust and of limited size. Moreover, its results do not depend on the hardware counter used.

According to one field of application of the digital counter, the method described hereinabove is especially useful for application to an acquisition of the cycle time camshaft equipping an internal combustion engine of an automobile vehicle. This cycle time is known at least approximately and a precise measurement of it is required. The digital counter and the method described hereinabove allow an advantageous compromise to be found between a high incrementation frequency of the hardware counter and a limited, or even zero, impact of the measurement on the processing operations of the processor in progress. Increasing the incrementation frequency of the hardware counter allows the precision to be increased. However, the price to be paid is that the number of overflows of the hardware counter or of incrementations of the software counter increases accordingly.

The results presented hereinabove have been obtained with a MPC5534 microcontroller whose processor works at a frequency of 40 MHz.

As shown, the method allows the period of time between the two edges i and j of the signal representing the duration of the cycle of the camshaft to be measured and hence the duration of the cycle of the camshaft to be measured.

With the methods for measuring a duration of the prior art, the execution time for each software read of the digital counter was 400 ns, while the loading of the processor used for the acquisition of the cycle of the camshaft with 10 edges i and j and 4 camshafts at 6000 revs/min was 0.8%.

With the method and the digital counter, the execution time for each software read of the digital counter is 200 ns, while the loading of the processor used for the acquisition of the cycle of the camshaft with 10 edges i and j and 4 camshafts at 6000 revs/min is only 0.04%. Thus, the method and the digital counter allow a gain in terms of execution time and of processor resource.

Furthermore, the use of a value with a 32-bit coding is optimized for the 32-bit microcontroller architectures. Indeed, for these architectures, all the operations on values with a 32-bit coding will be simplified compared to the operations on values with a 24-bit coding. Notably, no verification of the saturation or of the operations needed for values with a 24-bit coding will be necessary for values with a 32-bit coding.

The digital counter and the method are especially designed to be implemented in automobile vehicles and, in particular, for determining the speed of a vehicle. For this purpose, a sensor measures the speed of the vehicle and sends edges at a rate depending on the speed of the vehicle. The method and the digital counter according to the invention allow the period of time between two edges to be evaluated and hence the speed of the vehicle to be deduced from this.

Advantageously, the digital counter is suited to both a single-processor system and to a multiprocessor system, as long as the data from the software counter are managed in a memory shared between the processors.

It will be obvious to those skilled in the art that the present invention allows embodiments that can take many other specific forms without straying from the scope of application of the invention as claimed. Consequently, the present embodiments should be considered as illustrations but may be modified within the defined field by the scope of the appended claims.

The invention claimed is:

1. A method for measuring a period of time between two events (i and j), the method implementing a digital counter (1) comprising:
   a hardware counter (2) whose value is coded on n bits, and a software counter (3) whose value is coded on m bits,
   the method comprising a step for incrementing the software counter (3) at at least two predetermined values of the hardware counter (2), neither of these two values coinciding with an overflow of the hardware counter (2),
   characterized in that the value of the digital counter (1) is coded on m+n−1 consecutive bits of which:
   n least significant bits correspond to the value of the hardware counter (2), and
   m−1 most significant bits are defined as a function of the value of the software (3) and hardware (2) counters,
   the method furthermore comprising:
   a step for resetting the software counter (3) according to the value of the hardware counter (2) at the time of the first event (i),
   a step for reading and for saving the value of the hardware counter (2) at the time of the first event (i) and the value of the hardware counter (2) at the time of the second event (j),
   a step for calculating the number of overflows of the hardware counter (2) between the two events consisting in:
   calculating the difference between the value of the software counter (3) at the time of the second event (j) and the value of the hardware counter (2) at the time of the first event (i), and
   taking the value corresponding to the integer part of the difference previously calculated,
   a step for calculating the period of time between the two events on the basis of the value of the hardware counter (2) at the time of the first event (i), the value of the hardware counter (2) at the time of the second event (j) and the number of overflows previously calculated.

2. The method as claimed in claim 1, characterized in that the step for incrementing the software counter (3) is carried out when the value of the hardware counter (2) corresponds to one quarter and to three quarters of its maximum value.

3. The method as claimed in claim 2, characterized in that the step for resetting the software counter (3) consists in assigning to the software counter (3):
- an initial value equal to half of the value of the hardware counter (2) when the value of the hardware counter (2) at the time of the first event (i) is greater than or equal to zero and strictly less than one quarter of its maximum value,
- an initial value equal to the maximum value of the hardware counter (2) when the value of the hardware counter (2) at the time of the first event (i) is greater than or equal to one quarter of its maximum value and strictly less than three quarters of its maximum value and,
- an initial value equal to three halves of the maximum value of the hardware counter (2) when the value of the hardware counter (2) at the time of the first event (i) is greater than or equal to three quarters of its maximum value and strictly less than its maximum value.

4. The method as claimed in claim 1, characterized in that the step for calculating the period of time between the two events (i and j) consists in adding, to the number of overflows of the hardware counter (2) between the two events, the value corresponding to the difference between the value of the hardware counter (2) at the time of the second event (j) and the value of the hardware counter (2) at the time of the first event (i).

5. The method as claimed in claim 2, characterized in that the priority level of the reset step and of the step for incrementing the software counter (3) is determined in order to allow the implementation of the incrementation prior to the expiration of a time corresponding to a quarter of the period of the hardware counter (2).

6. A digital counter (1) designed to measure a period of time between two events (i and j) comprising:
- a hardware counter (2) whose value is coded on n bits, and
- a software counter (3) whose value is coded on m bits,
- the software counter (3) being incremented at at least two predetermined values of the hardware counter (2), neither of these two values coinciding with an overflow of the hardware counter (2), characterized in that the value of the digital counter (1) is coded on m+n−1 consecutive bits of which:
- n least significant bits correspond to the value of the hardware counter (2), and
- m−1 most significant bits are defined as a function of the value of the software (3) and hardware (2) counters,
- the digital counter (1) allowing a method according to claim 1.

7. The digital counter (1) as claimed in claim 6, characterized in that it is connected to a processor capable of reading the value of the hardware counter (2), resetting the software counter (3) and performing the calculations, the processor being connected to at least one storage medium on which it stores data.

8. The digital counter (1) as claimed in claim 6, characterized in that the period (T) of the hardware counter (2) is determined by the number of bits (n) on which the value of the hardware counter (2) is coded and by the frequency at which the hardware counter (2) is incremented, this frequency being an integer fraction of the clock frequency of the processor.

9. The digital counter (1) as claimed in claim 6, characterized in that the number n of bits is equal to 24 and in that the number m of bits is equal to 9 such that the value of the digital counter (1) is coded on 32 consecutive bits.

* * * * *